US011961648B2

(12) United States Patent
Tang et al.

(10) Patent No.: US 11,961,648 B2
(45) Date of Patent: Apr. 16, 2024

(54) RAPID DEMAGNETIZATION METHOD BASED ON CHARACTERISTICS OF MAGNETIC MEDIA

(71) Applicant: Beijing University of Technology, Beijing (CN)

(72) Inventors: Jian Tang, Beijing (CN); Zhe Xu, Beijing (CN); Pengsheng Li, Beijing (CN); Xiaoge Liu, Beijing (CN)

(73) Assignee: Beijing University of Technology, Beijing (CN)

( * ) Notice: Subject to any disclaimer, the term of this patent is extended or adjusted under 35 U.S.C. 154(b) by 222 days.

(21) Appl. No.: 17/541,903

(22) Filed: Dec. 3, 2021

(65) Prior Publication Data

US 2022/0093307 A1 Mar. 24, 2022

Related U.S. Application Data

(63) Continuation of application No. PCT/CN2020/080527, filed on Mar. 21, 2020.

(30) Foreign Application Priority Data

Oct. 21, 2019 (CN) .......................... 201910998277.0

(51) Int. Cl.
*H01F 13/00* (2006.01)
*G01R 33/02* (2006.01)
(52) U.S. Cl.
CPC ........... *H01F 13/006* (2013.01); *G01R 33/02* (2013.01)
(58) Field of Classification Search
CPC ... H01F 13/006; G01R 33/02; G01R 33/1215; G11B 5/024; G11B 5/012
See application file for complete search history.

(56) References Cited

U.S. PATENT DOCUMENTS 4,821,127 A * 4/1989 Soga ...................... G11B 15/12
5,132,860 A 7/1992 Von Stein
(Continued)

FOREIGN PATENT DOCUMENTS

CH 707443 A2 * 7/2014 .......... H01F 13/006
CN 2922041 Y 7/2007
(Continued)

OTHER PUBLICATIONS

Sun Weiping, Han Junmin. Information Elimination of Magnetic Data Storage Media[J].Recording Media Technology,2006(3):31-34.
(Continued)

*Primary Examiner* — Mohamad A Musleh

(57) ABSTRACT

A rapid demagnetization method based on characteristics of magnetic media. In the method, basic information is obtained by a recognition module of magnetic media by means of multi-source sensing collaboration. The magnetic medium is identified by using a data processing technology and a magnetic medium identification algorithm, and then the characteristic information is extracted. Optimized set values of demagnetization parameters are obtained by a demagnetization parameter optimizing and setting module based on a demagnetization optimizing model. Demagnetization parameter set values are tracked by a closed-loop control module of a demagnetization magnetic field in combination with domain expert knowledge by using a closed-loop control mechanism integrated with a magnetic field control algorithm, a charging-discharging device, a magnetic field generating device, a magnetic field sensor and an environmental sensor, completing the rapid demagnetization of the magnetic medium.

4 Claims, 2 Drawing Sheets

(56) References Cited

U.S. PATENT DOCUMENTS

| | | | |
|---|---|---|---|
| 7,724,490 | B2 | 5/2010 | Tamura et al. |
| 8,064,183 | B2 | 11/2011 | Olliges |
| 10,242,699 | B1 | 3/2019 | Ebadian et al. |
| 10,366,711 | B1 | 7/2019 | Liu et al. |
| 10,438,614 | B1 | 10/2019 | Wang et al. |
| 2015/0016006 | A1* | 1/2015 | van Vroonhoven .. H01F 13/006 361/149 |
| 2017/0243682 | A1 | 8/2017 | Honda |

FOREIGN PATENT DOCUMENTS

| | | | |
|---|---|---|---|
| CN | 101064107 A | 10/2007 | |
| CN | 101138055 A | 3/2008 | |
| CN | 103294960 A | 9/2013 | |
| CN | 103295587 A | 9/2013 | |
| CN | 103310802 A | 9/2013 | |
| CN | 103400586 A | 11/2013 | |
| CN | 103544764 A | 1/2014 | |
| CN | 203422923 U | 2/2014 | |
| CN | 102364577 B | 9/2014 | |
| CN | 205609215 U | 9/2016 | |
| CN | 103456315 B | 2/2017 | |
| CN | 107346210 A | 11/2017 | |
| CN | 110797052 A | 2/2020 | |
| CN | 111858552 B | * 5/2022 | ........... G06F 16/219 |

OTHER PUBLICATIONS

Cheng Yu. Research on Magnetic Media Data Destruction Technology. Doctoral dissertation, University of Electronic Science and Technology of China. 2010.

Yan Guoqing, Xu Zhenming.Methods of Security Destruction and Techniques of Resources Recycling for Storage Medium[J]. Materials Guide,2013,27(3):12-17.

Lu Xinghua, Liu Zengliang .Research on Data Remaining and Safe Deletion Methods[J].Microcomputer Information, 2005(23):11-13.

Li Tao.Information Storage and Information Destruction Technology[J]. Cyberspace Security,2010(6):45-48.

Katti R R, Servan-Schreiber F, Kryder M H.Erasure in particulate and thin-film disk media[J].Journal of Applied Physics, 1987,61(8):4037-4039.

Lekawat L, Spratt G W D, Kryder M H.Erasure and noise study in barium-ferrite tape media[J].Journal of applied physics,1993,73(10):6719-6721.

Mountfield K R, Kryder M H. The effect of aging on erasure in particulate disk media[J].IEEE Transactions on Magnetics, 1989,25(5):3638-3640.

Yan Aijun,Qian Limin,Wang Pu.Comparative Research on the Allocation Model of Case Reasoning Attribute Weights [J].Acta Automatica Sinica, 2014,40(09):1896-1902.

Ding Xiaoling,Zhao Qiang,Li Yibin,Ma Xin.Improved target recognition algorithm based on template matching[J]. Journal of Shandong University(Engineering Science Edition),2018,48(02):1-7.

Li Long,Wei Jing,Li Canbing,Cao Yijia,Song Junying,Fang 80. Load model forecasting based on artificial neural network [J]. Transactions of the Chinese Society of Electrical Engineering,2015,30(08):225-230.

Zeng Congji, Shan Liang, Lu Jianrong. Research on Intelligent Partition PID Control Algorithm in Electric Cylinder Servo System[J]. Computer Measurement and Control, 2015,23(06):1967-1971.

Xin Bin,Chen Jie,Peng Zhihong.Intelligent Optimal Control: Overview and Prospects[J].Acta Automatica Sinica, 2013,39(11):1831-1848.

* cited by examiner

RAPID DEMAGNETIZATION METHOD BASED ON CHARACTERISTICS OF MAGNETIC MEDIA

CROSS-REFERENCE TO RELATED APPLICATIONS

This application is a continuation of International Patent Application No. PCT/CN2020/080527, filed on Mar. 21, 2020, which claims the benefit of priority from Chinese Patent Application No. 201910998277.0, filed on Oct. 21, 2019. The content of the aforementioned application, including any intervening amendments thereto, is incorporated herein by reference in its entirety.

TECHNICAL FIELD

This application relates to storage media, and more particularly to a rapid demagnetization method based on characteristics of a magnetic media.

BACKGROUND

Storage media generally include hard disks, optical disks, USB flash drives, solid-state drives, memory cards and special chips, which can be further divided into magnetic and non-magnetic media. Among them, the magnetic recording media can be used repeatedly for recording, and thus has been employed as one of the main information storage media in various professional applications and consumer electronics. In the actual application, the recorded information needs to be removed for repeated uses. Currently, the information removal is performed by formatting or direct overwriting, which may lead to private information leakage. Therefore, it is necessary to adopt a demagnetization method to completely remove the original data to meet the requirements of commercial departments (such as software duplication, audio-visual work manufacturing, and data processing centers) for the elimination of rewriting noise, as well as meet the requirements of military, confidential, and financial departments for data security and confidentiality.

In the process of recording data on the magnetic media, electrical signals representing data "0" and "1" are converted into remanent magnetic bits on the magnetic recording medium in an opposite direction through a write head. With respect to the data reading, the polarity of magnetic particles is converted into electrical pulse signals, which are further turned into computer-usable data via a data converter. In essence, the elimination of information on the magnetic media is to change the polarity of the remanent magnetic bits representing data into a disorderly arrangement by externally imposing a strong magnetic field. During the demagnetization process, the magnetic media is converted to a magnetic neutral state with zero remanence or a unidirectional saturated state with the same magnetization direction. The demagnetization method is generally divided into the alternating current (AC) method and the direct current (DC) method, in which the former has the characteristics of large volume and high cost and is suitable for fixed subjects; while the latter generally adopts a high-performance permanent magnet material with small size and low cost, and is suitable for mobile subjects. In terms of the demagnetization effect, the latter is weaker than the former due to the presence of DC noise.

It has been demonstrated that the demagnetization of the magnetic media is mainly affected by the intensity of the demagnetization field, the demagnetization angle, and the type coercive force, squareness ratio, switching field distribution and particle orientation of the magnetic media. In order to optimize the demagnetization effect, with respect to the multiple relationship between the strength of the demagnetization magnetic field and the coercive force of the media and the time-varying characteristics of the coercive force, extensive researches have been conducted. For example, it has been pointed out that the intensity of the magnetic field should be at least 5 times the coercive force of the magnetic media, and the coercive force of the magnetic media tends to increase with the aging of the magnetic media (Lu Xinghua, Liu Zengliang, Study on the data remanence and safe deleting method. Microcomputer Information, 2005 (23): 11-13). It has also been found that different magnetic mediums (such as have hard disks and magnetic tapes) vary significantly in the coercive force, and the coercive force increases with the increase of the magnetic recording density (Li Tao, Technology of information storage and information destruction. Cybersecurity, 2010(6): 45-48). According to the Data Cleaning and Processing Standards published by U.S. Department of Defense, the intensity of the external magnetic field should be at least twice the coercive force of the magnetic medium to be demagnetized, while Sun Weiping et al. (Sun Weiping & Han Junmin, Information erasure of magnetic storage media. China Mediatech, 2006(3): 31-34] suggested that according to the rule of thumb, the intensity of the demagnetization magnetic field should be more than 3 times the coercive force of the medium to be demagnetized. Katti, Romney, R, et al. (Katti R R, Servan-Schreiber F, Kryder M H. Erasure in particulate and thin-film disk media. Journal of Applied Physics, 1987, 61(8): 4037-4039) mentioned that the orientation dispersion of the hard-disk particles and film-disk particles has a great influence on the difficulty of demagnetization. Lekawat L et al. (Lekawat L, Spratt G, Kryder M H. Erasure and noise study in barium—ferrite tape media. Journal of Applied Physics, 1993, 73(10):6719-6721) asserted that the effects of the material of the magnetic powder in different demagnetization methods are different. Moreover, the aging degree of hard disks and the ambient temperature also have an effect on the demagnetization of magnetic media (Mountfield K R, Kryder M H. The effect of aging on erasure in particulate disk media. IEEE Transactions on Magnetics, 1989, 25(5): 3638-3640). It can be concluded from the above researches that there is currently no unified standard for the magnitude of the demagnetization magnetic field, and there is still a lack of detailed and precise mechanism analysis and data support. Nevertheless, it is clear that the different magnetic mediums vary in the coercive force and material property, and the corresponding intensity of the magnetic field and the demagnetization mode are also different. Therefore, it is necessary to study the influence of the magnetic field intensity and demagnetization mode on the demagnetization of different magnetic mediums.

The demagnetization effect can be evaluated directly or indirectly. The direct method is carried out by measuring and analyzing the level of the residual signal on the magnetic medium before and after the demagnetization, in which the amplitude of the residual signal generally should be reduced to less than 90 dB (approximately 0.003%) of the original amplitude. This method requires standard test equipment, demagnetization equipment, an amplifier with high sensitivity and low noise, and a spectrum analyzer. However, it is difficult to restore the precise initial coordination state after the disk and head of the hard disk are disassembled and reassembled, and thus it needs to build a dedicated test platform, which increases the implementation difficulty. The indirect method is carried out by observing the pattern change of the recording bit before and after the elimination of the recording signal of the magnetic medium using a magnetic force microscope (MFM). The demagnetization effect is evaluated by comparing the topography of the magnetic medium recording film and the magnetic force image of the recorded information bit before and after the demagnetization, and determining whether the magnetic spot that characterizes the written information on the magnetic medium disappears. Nevertheless, this method currently lacks the support of quantitative data, especially the research on the description of the gradual change of the magnetic spot.

In the prior art, Chinese Patent Application No. 201010564540.4, filed on Nov. 30, 2010, proposes a method of applying an attenuated strong magnetic field with a controllable alternating pulse to the magnetic medium, in which the DC demagnetization with a strong magnetic field and the AC demagnetization are performed in sequence, combining the advantages of DC demagnetization and AC demagnetization. The maximum magnetic field intensity is twice the coercive force of the magnetic material and is required to be at least 8000 Gs. Chinese Patent Application No. 201310176799.5, filed on May 14, 2013, points out that the disc should be paralleled to a direction of the static magnetic field, and the magnetic field intensity should be increased to at least 5000 Gs to ensure the demagnetization effect. Considering that the information can be recorded horizontally or vertically on the magnetic media, U.S. patent application Ser. No. 15/052,228 and U.S. Pat. No. 7,724,490B2 both disclose a demagnetization device that is provided with an inclined magnetic media placement device and a magnetic field generator. Chinese Patent Application No. 200620117963.0, filed on May 31, 2006, proposes a device that divides the demagnetization magnetic field into a horizontal magnetic field and a vertical magnetic field. Chinese Patent Application No. 201310446590.6 discloses a programmable constant current demagnetization device and a demagnetization method to reduce the power consumption of the demagnetization process. U.S. Pat. No. 5,132,860, published on Jul. 21, 1992, proposes a DC demagnetization device, which is formed by stepped magnetic pole arrangement of high-performance permanent magnet materials, and can optimize the demagnetization efficiency. U.S. patent application Ser. No. 15/987,453, filed on Mar. 26, 2019, proposes a single-magnetic pulse demagnetization device that can monitor the internal magnetic flux thereof during the capacitance charge and discharge cycle by detecting the current of the demagnetization coil. This device is aimed at ensuring that there is enough time and magnetic flux to act on the magnetic medium to be demagnetized by measuring the change curve of the magnetic flux with time by using a verification algorithm. U.S. Pat. No. 8,064,183B2, patented on Nov. 22, 2011, proposes the use of a single capacitor to charge the demagnetization coil from two different directions, thereby avoiding the use of demagnetization devices with multiple coils or multi-directional capacitors. It can be seen from the above-mentioned researches that the identification and feature extraction of the magnetic medium to be demagnetized have still not been investigated, and there is also less report about the optimization of the demagnetization parameters according to the characteristics of the magnetic medium, and the closed-loop control of the demagnetization magnetic field.

SUMMARY

It can be concluded from the above that in order to achieve the rapid and efficient demagnetization, it is necessary to obtain the characteristic information varying among different magnetic mediums, including magnetic recording mode, material property and coercive force, optimize the demagnetization parameters including demagnetization magnetic field intensity and demagnetization angle, and adopt a closed-loop control mechanism to enable the stable control of the demagnetization parameters. Therefore, this application discloses a rapid demagnetization method based on characteristics of magnetic media.

Technical solutions of the present disclosure are described as follows.

In view of the defects of low efficiency, high energy consumption and great difficulty in evaluating demagnetization effects in the current widespread use of expert experience or fixed model to set the same demagnetization voltage to demagnetize magnetic media with different characteristics, this application provides a rapid demagnetization method based on the characteristics of magnetic media, comprising:

(S1) acquiring basic information of a magnetic medium to be demagnetized through a multi-source sensing mode integrated with a bar code scanning and an image acquisition by using a magnetic medium recognition module, where the basic information of the magnetic medium to be demagnetized comprises brand, type, capacity and production time; and recognizing the magnetic medium to be demagnetized through a data processing technology and a magnetic medium recognition algorithm to extract characteristic information of the magnetic medium to be demagnetized, where the characteristic information of the magnetic medium to be demagnetized comprises magnetic recording mode, material characteristic and coercive forces;

(S2) optimizing demagnetization parameters for the magnetic medium to be demagnetized via a demagnetization parameter optimizing module based on a demagnetization optimizing model to obtain a set value of the demagnetization parameters, where the demagnetization parameters comprise an intensity of a demagnetizing magnetic field and demagnetization angle; and (S3) tracking the set value of the demagnetization parameters via a closed-loop control module of the demagnetizing magnetic field combined with domain expert knowledge based on a closed-loop control mechanism integrated with a magnetic field control algorithm, a charging and discharging device, a magnetic field generating device, a magnetic field sensor and an environmental sensor to realize a rapid demagnetization of the magnetic medium to be demagnetized.

DETAILED DESCRIPTION OF EMBODIMENTS

Figure 1:
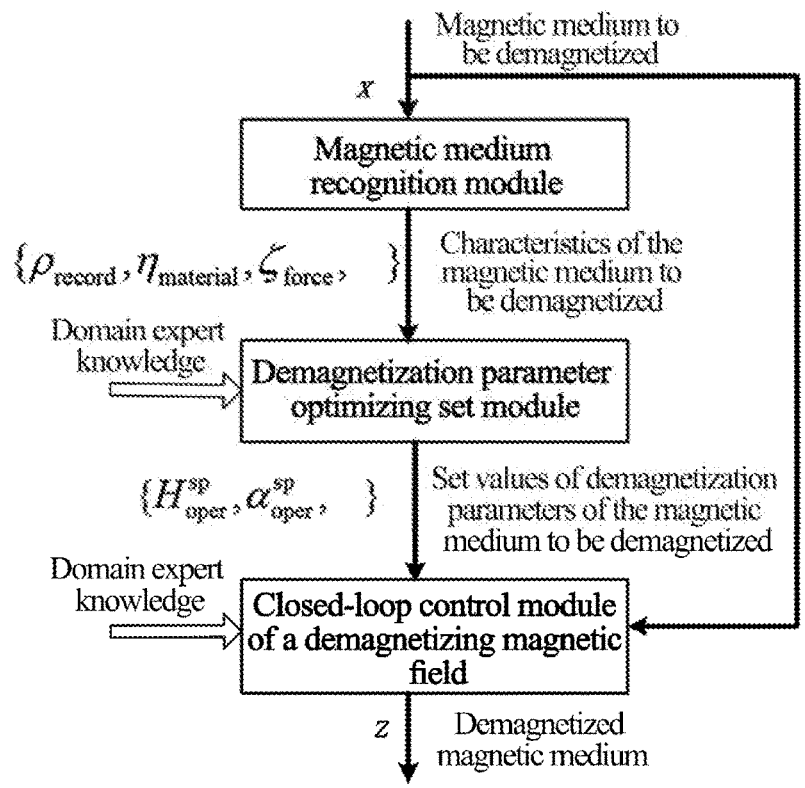
FIG. 1 schematically illustrates an overall structure of a device for implementing a demagnetization method according to an embodiment of the present disclosure.

Provided herein is a rapid demagnetization method based on the characteristics of magnetic media, which is implemented by using a magnetic medium recognition module, a demagnetization parameter optimization module and a closed-loop control module of a demagnetizing magnetic field, as shown in FIG. 1.

In the magnetic medium recognition module, an input is the magnetic medium to be demagnetized, defined as X. An output is the characteristic information of the magnetic medium to be demagnetized, defined as $\{\rho_{record}, \eta_{material}, \zeta_{force}, \ldots\}$. The magnetic medium recognition module is configured to recognize the magnetic medium to be demagnetized based on a variety of sensors and extract its characteristic information. The mapping relationship between X and, $\{\rho_{record}, \eta_{material}, \zeta_{force}, \ldots\}$ is shown in equation (1):

$$\{\rho_{record}, \eta_{material}, \zeta_{force}, \ldots\} = f_{iden}(X) \tag{1}$$

where $\{\rho_{record}, \eta_{material}, \zeta_{force}, \ldots\}$ is the characteristic information of the magnetic medium to be demagnetized, which includes magnetic recording mode, material characteristic, and coercive force; X is the magnetic medium to be demagnetized; and $f_{iden}(\cdot)$ is a mapping model for medium characteristic recognition.

In the demagnetization parameter optimization module, an input is the characteristic information $\{\rho_{record}, \eta_{material}, \zeta_{force}, \ldots\}$. An output is an optimized set value $\{H_{oper}^{sp}, \alpha_{oper}^{sp}, \ldots\}$ of the demagnetization parameters. The demagnetization parameter optimization module is configured to obtain the optimized set value of the magnetic medium to be demagnetized based on characteristics of the magnetic medium and domain expert knowledge. The mapping relationship between $\{\rho_{record}, \eta_{material}, \zeta_{force}, \ldots\}$ and $\{H_{oper}^{sp}, \alpha_{oper}^{sp}, \ldots\}$ is shown in equation (2);

$$\{H_{oper}^{sp}, \alpha_{oper}^{sp}, \ldots\} = f_{paraset}(\{\rho_{record}, \eta_{material}, \zeta_{force}, \ldots\}) \tag{2}$$

where $\{H_{oper}^{sp}, \alpha_{oper}^{sp}, \ldots\}$ represents the optimized set value of the demagnetization parameters consisting of the intensity of the demagnetized magnetic field and demagnetization angle; and $f_{paraset}(\cdot)$ represents a mapping model for obtaining optimized set value of the demagnetization parameters.

In the closed-loop control module of the demagnetizing magnetic field, an output includes the optimized set value of the demagnetization parameters, an intensity $H_{oper}^{pv}$ of the demagnetized magnetic field measured by a flux meter, environmental parameters $\{t_{emperature}, H_{umidity}, \ldots\}$, the magnetic medium to be demagnetized, and domain expert knowledge. An output is the demagnetized magnetic medium Z. The closed-loop control module is configured to demagnetize the magnetic medium to be demagnetized based on the set value of the demagnetization parameters of the magnetic medium and domain expert knowledge. The corresponding mapping relationship is shown in equation (3):

$$Z = f_{control}^{close}(X, \{H_{oper}^{sp}, \alpha_{oper}^{sp}, \ldots\}, H_{oper}^{pv}, \{t_{emperature}, H_{umidity}, \ldots\}) \tag{3}$$

where $f_{control}^{close}$ represents a combination of an intelligent algorithm, neural network, template reasoning, and case reasoning algorithms for the demagnetizing magnetic field. The demagnetization process is shown in equation (4):

$$X \xrightarrow{f_{idea}(\cdot)} \{\rho_{record}, \eta_{material}, \zeta_{force}, \ldots\} \xrightarrow{f_{paraset}(\cdot)} \{H_{oper}^{sp}, \alpha_{oper}^{sp}, \ldots\} \xrightarrow{f_{control}^{close}(\cdot)} U_{oper}^{cv} \xrightarrow{f_{demag}(\cdot)} Z; \tag{4}$$

where $f_{demag}(\cdot)$ represents a physical process of demagnetization; and Z represents the demagnetized magnetic medium.

Figure 2:
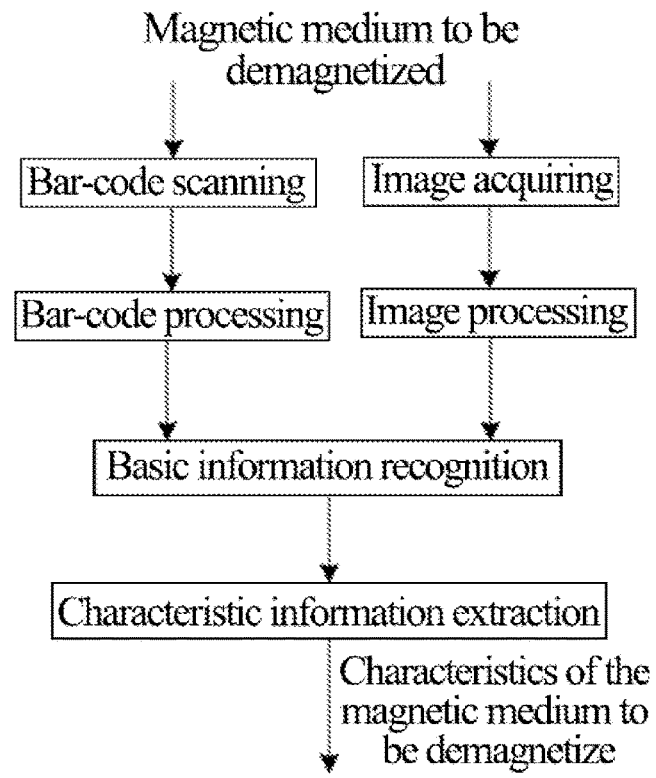
FIG. 2 is a flowchart of characteristic recognition of a magnetic medium according to an embodiment of the present disclosure.

A specific workflow of the magnetic medium recognition module is shown in FIG. 2.

An input is the magnetic medium to be demagnetized, defined as X. An output is the information of the magnetic medium to be demagnetized, defined as $\{\rho_{record}, \eta_{material}, \zeta_{force}, \ldots\}$. An intermediate process involves a bar code scanning sub-module, a bar code processing sub-module, an image acquisition sub-module, an image processing sub-module, and a recognition sub-module of basic information of the magnetic medium, a characteristics information extraction sub-module and other sub-modules.

A basic structure of a magnetic medium recognition database is designed, shown as equation (5):

$$[\{Plant, SN\}, \{Capicity, Revolution, ProTime, \ldots\}, \{\rho_{record}, \eta_{material}, \zeta_{force}, \ldots\}] \tag{5}$$

where $\{Plant, SN\}$ represents a complete identification code consisting of manufacturer and serial number; and $\{Capicity, Revolution, ProTime, \ldots\}$, represents a basic information consisting of capacity, revolution production time of a magnetic medium.

A basic structure of a magnetic medium characteristic database is designed, shown as equation (6):

$$[\{Plant, SN\}, \{\rho_{record}, \eta_{materia}, \zeta_{force}, \ldots\}, \{H_{oper}^{sp}, \alpha_{oper}^{sp}, \ldots\}] \tag{6}$$

The magnetic medium to be demagnetized X is performed with the following steps.

First, in a bar code scanning module, a bar code $\{X_{code}, \ldots\}$ of X based on an optical device is scanned by a bar code scanner to obtain an optical signal, where the bar code $\{X_{code}, \ldots\}$ includes an SN code. The optical signal are converted into an electrical signal, and then into a digital signal. In a bar code processing module, the digital signal are processed according to a decoding algorithm to obtain a number or letter symbol $\{X'_{SN}, \ldots\}$ representing an SN code and corresponding to the bar code of X, expressed by equation (7):

$$X \xrightarrow{f_{scan}(\cdot)} \{X_{code}, \ldots\} \xrightarrow{f_{decode}(\cdot)} \{X'_{SN}, \ldots\}; \tag{7}$$

where is $f_{scan}(\cdot)$ represents a process of scanning the bar code of X; and $f_{decode}(\cdot)$ represents a process of decoding the bar code.

At this time, in an image acquisition module, an image $X_{image}$ of the magnetic medium to be demagnetized X is acquired via a camera device. In an image processing module, a basic information $\{X'_{plant}, \ldots\}$, including manufacturer, capacity, revolution and production time of the magnetic medium to be demagnetized, is extracted according to an image recognition algorithm, expressed as equation (8):

$$X \xrightarrow{f_{camera}(\cdot)} \{X_{image}, \ldots\} \xrightarrow{f_{image}^{iden}(\cdot)} \{X'_{Plant}, \ldots\}; \tag{8}$$

where $f_{camera}(\cdot)$ represents a process of acquiring the image of X; and $f_{image}^{iden}(\cdot)$ represents the image recognition algorithm for identifying the basic information $\{X'_{Plant}, \ldots\}$ of X.

In a magnetic medium basic information recognition sub-module, if it is capable of obtaining the complete identification code {Plant,SN} from the magnetic medium recognition database by matching through fusion of {$X'_{SN}$, ... } and {$X'_{Plant}$, ... }, the recognition of the magnetic medium to be demagnetized can be complete the identify. Then the characteristic information {$\rho_{record}$, $\eta_{material}$, $\zeta_{force}$, ... }, including magnetic recording mode, material characteristic, and coercive force is extracted from the magnetic medium characteristic database.

if it fails to obtain the complete identification code {Plant,SN} from the magnetic medium recognition database by matching through the fusion of {$X'_{SN}$, ... } and {$X'_{Plant}$, ... }, in a magnetic medium characteristic information extraction sub-module, a similarity matching is performed in a magnetic medium characteristic database according to the basic information {Capicity, Revolution, ProTime, ... }, obtained from {$X'_{SN}$, ... } and {$X'_{Plant}$, ... }. The characteristic information {$\rho_{record}$, $\zeta_{material}$, $\zeta_{force}$, ... } of the magnetic medium to be demagnetized is acquired, as shown in equation (9):

$$\{Capicity, Revolution, ProTime, ... \} \xrightarrow{f_{match}^{iden}(\cdot)} \{\rho_{record}, \eta_{material}, \zeta_{force}, ... \}; \qquad (9)$$

where $f_{match}^{iden}(\cdot)$ is a matching model based on a case-based reasoning algorithm.

The case-based reasoning algorithm was reported by Yan Aijun et. al (Yan aijun, Qian limin, and Wang pu. A Comparative Study of Attribute Weights Assignment for Case-based Reasoning. Acta Automatica Sinica. 2014, 40(09):1896-1902).

Figure 3:
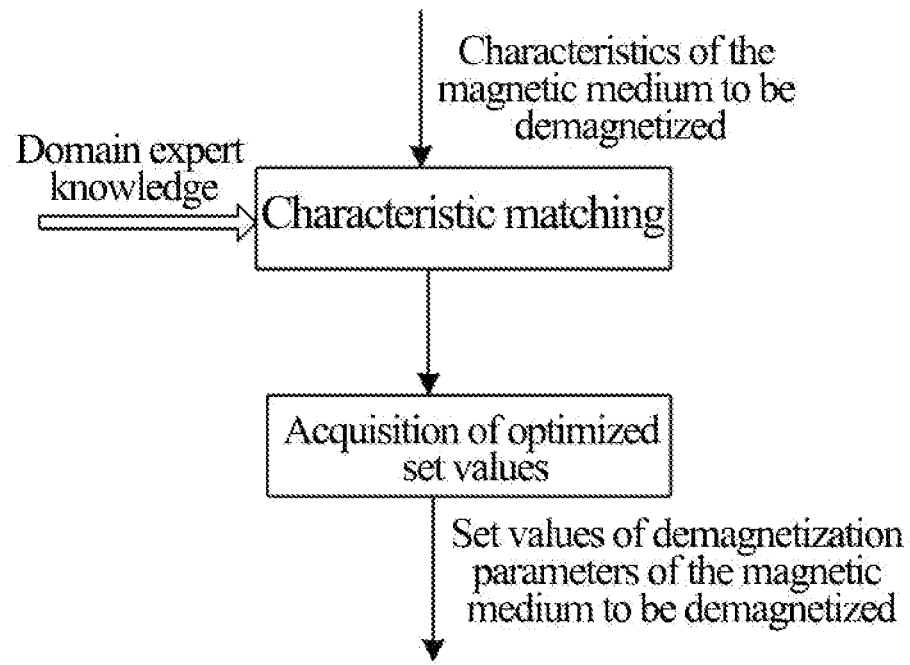
FIG. 3 is a flowchart of optimization and setting of demagnetization parameters according to an embodiment of the present disclosure.

A specific workflow of the demagnetization parameter optimizing module is shown in FIG. 3.

An input includes the characteristic information {$\rho_{record}$, $\eta_{material}$, $\zeta_{force}$, ... } and domain expert. An output an optimized set value {$H_{oper}^{sp}$, $\alpha_{oper}^{sp}$, ... } of the demagnetization parameters including the intensity of the demagnetizing magnetic field and demagnetization angle. The intermediate process involves a magnetic medium characteristic matching sub-module and an optimized set value acquisition sub-module, expressed as equation (10):

$$\{H_{oper}^{sp}, \alpha_{oper}^{sp}, ... \} = f_{paraset}(\{\rho_{record}, \eta_{material}, \zeta_{force}, ... \}) \qquad (10);$$

where {$H_{oper}^{sp}$, $\alpha_{oper}^{sp}$, ... } represents the optimized sett values of the demagnetization parameters consisting of the intensity of the demagnetized magnetic field and demagnetization angle; and $f_{paraset}(\cdot)$ represents a mapping model configured to obtain the optimized set value of the demagnetization parameters.

The following processes are executed based on the characteristic information of the magnetic medium to be demagnetized and domain expert knowledge.

The characteristic information of the magnetic medium to be demagnetized is matched with characteristics of the magnetic medium characteristic database to obtain a matching rate $\xi_{newdisk}^{feature}$, expressed by equation (11)

$$\{\rho_{record}, \eta_{material}, \zeta_{force}, ... \} \xrightarrow{f_{match}^{object}(\cdot)} \xi_{newdisk}^{feature}; \qquad (11)$$

where $f_{match}^{opiset}(\cdot)$ is a matching model based on a template matching algorithm.

The template matching algorithm was reported by Ding xiaoling et al. (Ding Xiaoling, Zhao Qiang, Li Yibin, and Ma xin. Modified Target Recognition Algorithm Based On Template Matching. Journal of Shandong University (Engineering Science), 2018, 48(2): 1-7.).

$\xi_{newdisk}^{feature}$ is compared with a set threshold value $\theta_{threshold}^{feature}$ provided by a technician performing a demagnetization operation. If $\xi_{newdisk}^{featue} \leq \theta_{threshold}^{feature}$, which indicates that a degree of matching is within an allowable set threshold value, a prediction based on the characteristic information of the magnetic medium to be demagnetized using a constructed demagnetization parameter optimizing and setting model $f_{optiset}(\cdot)$ (is to obtain the optimal set value of the demagnetization parameters, expressed by equation (12)

$$\begin{cases} \{H_{oper}^{pre}, \alpha_{oper}^{pre}, ... \} = f_{optiset}(\{\rho_{record}, \eta_{material}, \zeta_{force}, ... \}) \\ \{H_{oper}^{sp}, \alpha_{oper}^{sp}, ... \} = \{H_{oper}^{pre}, \alpha_{oper}^{pre}, ... \} \end{cases} ; \qquad (12)$$

where {$H_{oper}^{pre}$, $\alpha_{oper}^{pre}$, ... } is a prediction value of a demagnetization parameter optimizing and setting model obtained based on $f_{optiset}(\cdot)$ using the {$\rho_{record}$, $\eta_{material}$, $\zeta_{force}$, ... } as input; and $f_{optiset}(\cdot)$ is constructed using a neural network algorithm.

The neural network algorithm was reported by Li long et. al (Li Long, Wei Jing, Li Canbing, Cao Yijia, Song Junying, Fang Baling. Prediction of Load Model Based on Artificial Neural Network. Transactions of China Electrotechnical Society, 2015, 30(8): 225-230).

If $\xi_{newdisk}^{feature} > \theta_{threshold}^{feature}$, which indicates that a degree of matching is not within the allowable set threshold value, a default set value of the demagnetization parameters is taken as a current optimized set value of the demagnetization parameters of the magnetic medium to be demagnetized, expressed by equation (13)

$$\{H_{oper}^{sp}, \alpha_{oper}^{sp}, \quad . \quad . \quad . \quad \} = \{H_{oper}^{default}, \alpha_{oper}^{default}, ... \} \qquad (13).$$

Figure 4:
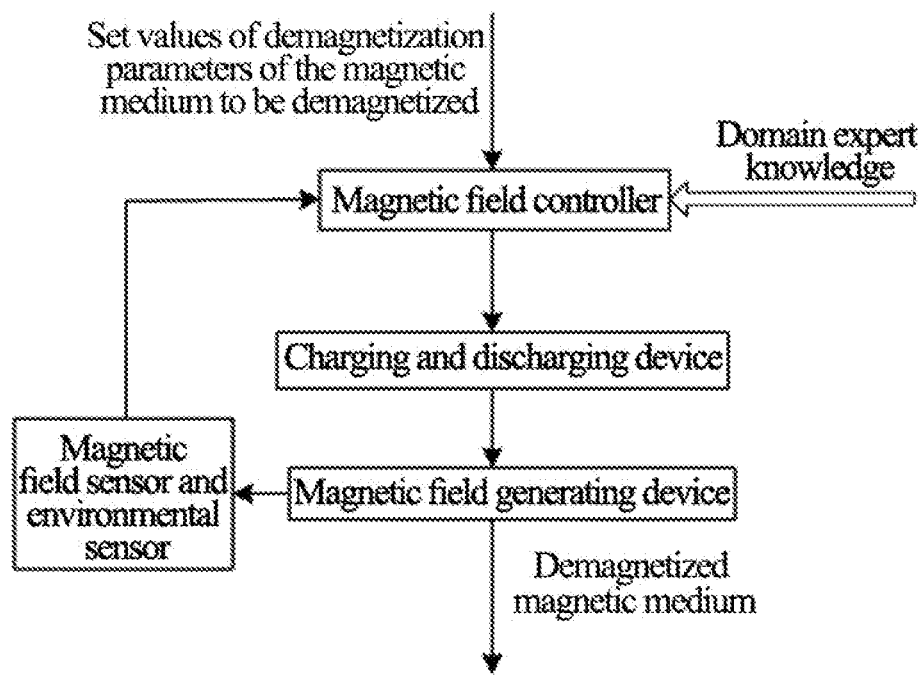
FIG. 4 is a flowchart of a closed-loop control of a demagnetizing magnetic field according to an embodiment of the present disclosure.

A specific workflow of the closed-loop control module of the demagnetizing magnetic field is shown in FIG. 4.

An input includes the optimized set value of the demagnetization parameters, an intensity $H_{oper}^{pv}$ of the demagnetizing magnetic field measured by a flux meter, environmental parameters measured by temperature and humidity sensors, the magnetic medium to be demagnetized and domain expert knowledge. An output is the magnetic medium to be demagnetized. The intermediate process involves a magnetic field controller sub-module, a charging and discharging device sub-module, a magnetic field generating device sub-module and a magnetic field sensor and environmental sensor sub-module.

In the magnetic field controller sub-module, the optimized set value of the demagnetization parameters, domain expert knowledge, and measuring values measured by a magnetic field sensor and an environmental sensor are fed back to a magnetic field controller. A demagnetization voltage required is acquired by the magnetic field controller via an intelligent PID algorithm controlled by the demagnetizing magnetic field, expressed by equation (14):

$$U_{oper}^{cv} = f_{control}(\{H_{oper}^{sp}, \alpha_{oper}^{sp}\}, H_{oper}^{pv}, \{t_{emperature}, H_{umidity}, ... \}) \qquad (14);$$

where $U_{oper}^{cv}$ is the demagnetization voltage; $H_{oper}^{pv}$ is the intensity of the demagnetizing magnetic field measured by the flux meter; {$t_{emperature}$, $H_{umidity}$, ... } represents environmental parameters including temperature and humidity;

and $f_{control}(\cdot)$ represents the intelligent PID algorithm for controlling the demagnetizing magnetic field.

The Intelligent PID algorithm was reported by Zeng congji et al. (Zeng congji, Shan Jiang, and Lu jianrong. Studies of the intelligent partition PID control algorithm in the electric cylinder servo system. Computer Measurement & Control, 2015, 23(6): 1967-1971) and Xin bin et al. (Xin Bin, Chen Jie, Peng Zhihong. Intelligent Optimized Control: Overview and Prospect. Acta Automatica Sinica. 2013, 39(11): 1831-1848).

In the charging and discharging device sub-module, the demagnetization voltage $U_{oper}^{cv}$ in a form of a digital signal output by the magnetic field controller is transferred to a charging and discharging device to generate an actual demagnetization voltage value $U'_{oper}^{cv}$ through a power supply, a high-capacity capacitor, a resistor-capacitor-inductor (RLC) oscillation circuit and a voltage multiplier circuit, expressed by equation (15):

$$U_{oper}^{cv} \xrightarrow{f_{circuit}(\cdot)} U'_{oper}^{rcv}; \qquad (15)$$

where $f_{circuit}(\cdot)$ indicates a demagnetization voltage generation circuit in the charging and discharging device; and $U_{oper}^{rcv}$ is the actual demagnetization voltage value generated by a demagnetization circuit.

In the magnetic field generating device sub-module, the actual demagnetization voltage value $U'_{oper}^{cv}$ generated in the charging and discharging device is transferred to a demagnetization coil in the magnetic field generating device to produce a demagnetizing magnetic field with an intensity of $H_{oper}^{Produce}$. At the same time, the magnetic medium to be demagnetized is demagnetized in the magnetic field generating device to obtain a demagnetized magnetic medium Z, expressed by equation (16):

$$U'_{oper}^{rcv} \xrightarrow{f_{coil}(\cdot)} H_{oper}^{Produce} \xrightarrow{f_{demag}(\cdot)} Z; \qquad (16)$$

where $f_{coil}(\cdot)$ is the demagnetization coil in the magnetic field generating device; $H_{oper}^{Produce}$ is the intensity of the generated demagnetizing magnetic field; $f_{demag}(\cdot)$ represents a physical process of demagnetization; and Z is the demagnetized magnetic medium.

In the magnetic field sensor and environmental sensor sub-module, a measured value $H_{oper}^{pv}$ of the intensity of the demagnetized field is acquired via the flux meter. Environmental data $\{t_{emperature}, H_{umidity}, \ldots\}$ is acquired via the temperature and humidity. $H_{oper}^{pv}$ and $\{t_{emperature}, H_{umidity}, \ldots\}$ are fed back to the magnetic field controller. Parameters of the magnetic field controller are modified in a closed loop, followed by being applied to demagnetization of a next magnetic medium to be demagnetized to ensure the stability of the demagnetizing field intensity.

The advantages of the present disclosure are described below.

(1) With respect to the issues, including the numerous brands and modes of the magnetic medium, different magnetic recording methods and magnetic recording densities, and the close relationship between the coercive force and the magnetic recording density and magnetic materials, and the time-varying of the coercive force with the aging of the magnetic medium, the method provided herein can identify the magnetic medium to be demagnetized and extract its characteristic information.

(2) With respect to the issue that the current intensity of the demagnetizing magnetic field, demagnetization voltage, demagnetization angle and other parameters are mainly set by expert experience or fixed models, and the issue that effective closed-loop control of the demagnetizing magnetic field has not been realized, the method provided herein combines the demagnetization parameter optimization set with the demagnetization magnetic field closed-loop control to realize the optimization set and closed-loop control of the demagnetization parameters for different magnetic media to ensure the rapidity and effectiveness of demagnetization.

What is claimed is:

1. A rapid demagnetization method based on characteristics of a magnetic media, comprising:
    (S1) acquiring basic information of a magnetic medium to be demagnetized through a multi-source sensing mode integrated with a bar code scanning and an image acquisition by using a magnetic medium recognition module, wherein the basic information of the magnetic medium to be demagnetized comprises brand, type, capacity and production time; and recognizing the magnetic medium to be demagnetized through a data processing technology and a magnetic medium recognition algorithm to extract characteristic information of the magnetic medium to be demagnetized, wherein the characteristic information of the magnetic medium to be demagnetized comprises magnetic recording mode, material characteristic and coercive force;
    (S2) optimizing demagnetization parameters for the magnetic medium to be demagnetized via a demagnetization parameter optimizing module based on a demagnetization optimizing model to obtain a set value of the demagnetization parameters, wherein the demagnetization parameters comprise intensity of a demagnetizing magnetic field and demagnetization angle; and
    (S3) tracking the set value of the demagnetization parameters via a closed-loop control module of the demagnetizing magnetic field combined with domain expert knowledge based on a closed-loop control mechanism integrated with a magnetic field control algorithm, a charging and discharging device, a magnetic field generating device, a magnetic field sensor and an environmental sensor to realize a rapid demagnetization of the magnetic medium to be demagnetized.

2. The rapid demagnetization method of claim 1, wherein an input of the magnetic medium recognition module is the magnetic medium to be demagnetized, defined as X; an output of the magnetic medium recognition module is the characteristic information of the magnetic medium to be demagnetized, defined as $\{\rho_{record}, \eta_{material}, \zeta_{force}, \ldots\}$; and the magnetic medium recognition module is operated through steps of:

designing a basic structure of a magnetic medium recognition database, shown as equation (1):

$$[\{Plant,SN\},\{Capicity,Revolution,ProTime, \ldots\},\{\rho_{record},\eta_{material},\zeta_{force}, \ldots\}] \qquad (1);$$

wherein {Plant,SN} represents a complete identification code consisting of manufacturer and serial number; and {Capicity,Revolution, ProTime, . . . }, represents a basic information consisting of capacity, revolution and production time of a magnetic medium;

designing a basic structure of a magnetic medium characteristic database, shown as equation (2)

$$[\{Plant, SN\}, \{\rho_{record}, \eta_{material}, \zeta_{force}, \ldots\}, \{H_{oper}^{sp}, \alpha_{oper}^{sp}, \ldots\}] \quad (2); \text{ and}$$

performing the following steps for the magnetic medium to be demagnetized X:

scanning, by a bar code scanner in a bar code scanning module, a bar code $\{X_{code}, \ldots\}$ of X based on an optical device to obtain an optical signal, wherein the bar code $\{X_{code}, \ldots\}$ comprises an SN code; converting the optical signal into an electrical signal, and then into a digital signal; and processing the digital signal according to a decoding algorithm in a bar code processing module to obtain a number or letter symbol $\{X'_{SN}, \ldots\}$ representing an SN code and corresponding to the bar code of X, expressed by equation (3):

$$X \xrightarrow{f_{scan}(\cdot)} \{X_{code}, \ldots\} \xrightarrow{f_{decode}(\cdot)} \{X'_{SN}, \ldots\}; \quad (3)$$

wherein $f_{scan}(\cdot)$ represents a process of scanning the bar code of X; and $f_{decode}(\cdot)$ represents a process of decoding the bar code;

collecting and acquiring, by a camera device in an image acquisition module, an image of the magnetic medium to be demagnetized X; and extracting a basic information $\{X'_{Plant}, \ldots\}$ comprising manufacturer, capacity, revolution and production time of the magnetic medium to be demagnetized according to an image recognition algorithm in an image processing module, expressed as equation (4):

$$X \xrightarrow{f_{camera}(\cdot)} \{X_{image}, \ldots\} \xrightarrow{f_{image}^{iden}(\cdot)} \{X'_{Plant}, \ldots\}; \quad (4)$$

wherein $f_{camera}(\cdot)$ represents a process of acquiring the image of X; and $f_{image}^{iden}(\cdot)$ represents the image recognition algorithm for identifying the basic information $\{X'_{Plant}, \ldots\}$ of X;

if it is capable of obtaining the complete identification code $\{Plant, SN\}$ from the magnetic medium recognition database by matching through fusion of $\{X'_{SN}, \ldots\}$ and $\{X'_{Plant}, \ldots\}$ in a magnetic medium basic information recognition sub-module, completing the recognition of the magnetic medium to be demagnetized; and extracting the characteristic information $\{\rho_{record}, \eta_{material}, \zeta_{force}, \ldots\}$ comprising the magnetic recording mode, material characteristic, and coercive force from the magnetic medium characteristic database; and if it fails to obtain the complete identification code $\{Plant, SN\}$ from the magnetic medium recognition database by matching through the fusion of $\{X'_{SN}, \ldots\}$ and, $\{X'_{Plant}, \ldots\}$ performing similarity matching in a magnetic medium characteristic database in a magnetic medium characteristic information extraction sub-module according to the basic information $\{Capicity, Revolution, ProTime, \ldots\}$, obtained from $\{X'_{SN}, \ldots\}$ and $\{X'_{Plant}, \ldots\}$; and acquiring the characteristic information $\{\rho_{record}, \eta_{material}, \zeta_{force}, \ldots\}$ of the magnetic medium to be demagnetized, as shown in equation (5):

$$\{Capicity, Revolution, ProTime, \ldots\} \xrightarrow{f_{match}^{iden}(\cdot)} \{\rho_{record}, \eta_{material}, \zeta_{force}, \ldots\}; \quad (5)$$

wherein $f_{match}^{iden}(\cdot)$ is a matching model based on a case-based reasoning algorithm.

3. The rapid demagnetization method of claim 2, wherein an input of the demagnetization parameter optimizing module is the characteristic information $\{\rho_{record}, \eta_{material}, \zeta_{force}, \ldots\}$, a type of the magnetic recording mode; a type of a hard disk material and a multiple of an intensity of an external magnetic field with respect to the coercive force of the magnetic medium to be demagnetized; an output of the demagnetization parameter optimizing module is an optimized set value $\{H_{oper}^{sp}, \alpha_{oper}^{sp}, \ldots\}$ of the demagnetization parameters comprising the intensity of the demagnetizing magnetic field and demagnetization angle; and an intermediate processing process of the demagnetization parameter optimizing module involves a magnetic medium characteristic matching sub-module and an optimized set value acquisition sub-module, expressed as equation (6):

$$\{H_{oper}^{sp}, \alpha_{oper}^{sp}, \ldots\} = f_{paraset}(\{\rho_{record}, \eta_{material}, \zeta_{force}, \ldots\}) \quad (6);$$

wherein $\{H_{oper}^{sp}, \alpha_{oper}^{sp}, \ldots\}$ represents the optimized set values of the demagnetization parameters consisting of the intensity of the demagnetizing magnetic field and demagnetization angle; and $f_{paraset}(\cdot)$ represents a mapping model configured to obtain the optimized set value of the demagnetization parameters;

based on the characteristic information of the magnetic medium to be demagnetized, the type of the magnetic recording mode and the multiple of intensity of an external magnetic field with respect to the coercive force of the magnetic medium to be demagnetized, the demagnetization parameter optimizing module executes the following steps:

matching the characteristic information of the magnetic medium to be demagnetized with characteristics in the magnetic medium characteristic database to obtain a matching rate $\xi_{newdisk}^{feature}$, expressed by equation (7):

$$\{\rho_{record}, \eta_{material}, \zeta_{force}, \ldots\} \xrightarrow{f_{match}^{object}(\cdot)} \xi_{newdisk}^{feature}; \quad (7)$$

wherein $f_{match}^{opiset}(\cdot)$ is a matching model based on a template matching algorithm;

comparing $\eta_{newdisk}^{feature}$ with a set threshold value $\theta_{threshold}^{feature}$ provided by a technician performing a demagnetization operation;

if feature $\eta_{newdisk}^{feature} \leq \theta_{threshold}^{feature}$, which indicates that a similarity between a hard disk to be demagnetized and a demagnetized hard disk in the database is considered by the technician to be within an allowable set threshold value, making a prediction based on the characteristic information of the magnetic medium to be demagnetized using a constructed demagnetization parameter optimizing and setting model $f_{optiset}(\cdot)$ to obtain the optimized set value $\{H_{oper}^{sp}, \alpha_{oper}^{sp}, \ldots\}$ of the demagnetization parameters, expressed by equation (8):

$$\begin{cases} \{H_{oper}^{pre}, \alpha_{oper}^{pre}, \dots\} = f_{optiset}(\{\rho_{record}, \eta_{material}, \zeta_{force}, \dots\}) \\ \{H_{oper}^{sp}, \alpha_{oper}^{sp}, \dots\} = \{H_{oper}^{pre}, \alpha_{oper}^{pre}, \dots\} \end{cases} \quad (8)$$

wherein $\{H_{oper}^{pre}, \alpha_{oper}^{pre}, \dots\}$ is a prediction value obtained based on $f_{optiset}(\cdot)$ using the $\{\rho_{record}, \eta_{material}, \eta_{force}, \dots\}$ as input; and $f_{optiset}(\cdot)$ is constructed using a neural network algorithm; and if $\xi_{network}^{feature} > \theta_{threshold}^{feature}$, which indicates that the similarity between a hard disk to be demagnetized and a demagnetized hard disk in the database is considered by the technician to be not within the allowable set threshold value, taking a default set value of the demagnetization parameters as a current optimized set value of the demagnetization parameters of the magnetic medium to be demagnetized, expressed by equation (9):

$$\{H_{oper}^{sp}, \alpha_{oper}^{sp}, \alpha_{oper}^{default}, \dots\} = \{H_{oper}^{default}, \alpha_{oper}^{default}, \dots\} \quad (9).$$

4. The rapid demagnetization method of claim 3, wherein an input of the closed-loop control module of the demagnetizing magnetic field comprises the optimized set value of the demagnetization parameters, an intensity $H_{oper}^{pv}$ of the demagnetizing magnetic field measured by a flux meter, environmental parameters measured by temperature and humidity sensors, the magnetic medium to be demagnetized, a range of the optimized set value of the demagnetization parameters, a range of the environmental parameters measured by temperature and humidity sensors and the type of the magnetic medium to be demagnetized; an output of the closed-loop control module is the magnetic medium to be demagnetized; an intermediate processing process of the closed-loop control module involves a magnetic field controller sub-module, a charging and discharging device sub-module, a magnetic field generating device sub-module, a magnetic field sensor and environmental sensor sub-module; and the closed-loop control module is operated through the following steps:

in the magnetic field controller sub-module, feeding the optimized set value of the demagnetization parameters, the range of the optimized set value of the demagnetization parameters, the range of the environmental parameters measured by the temperature and humidity sensors, the type of the magnetic medium to be demagnetized and values measured by a magnetic field sensor and an environmental sensor back to a magnetic field controller; and acquiring a demagnetization voltage required by the magnetic field controller via an intelligent PID algorithm for controlling the demagnetizing magnetic field, expressed by equation (10):

$$U_{oper}^{cv} = f_{control}(\{H_{oper}^{sp}, \alpha_{oper}^{sp}\}, H_{oper}^{pv}, \{t_{emperature}, H_{umidity}, \dots\}) \quad (10);$$

wherein $U_{oper}^{cv}$ is the demagnetization voltage; $H_{oper}^{pv}$ is the intensity of the demagnetizing magnetic field measured by the flux meter; $\{t_{emperature}, H_{umidity}, \dots\}$ represents environmental parameters comprising temperature and humidity; and $f_{control}(\cdot)$ represents the intelligent PID algorithm for controlling the demagnetizing magnetic field;

in the charging and discharging device sub-module, transferring the demagnetization voltage $U_{oper}^{cv}$ in a form of a digital signal output by the magnetic field controller to a charging and discharging device to generate an actual demagnetization voltage value $U'_{oper}^{cv}$ through a power supply, a high-capacity capacitor, a resistor-capacitor-inductor (RLC) oscillation circuit and a voltage multiplier circuit, expressed by equation (11):

$$U_{oper}^{cv} \xrightarrow{f_{circuit}(\cdot)} U'_{oper}^{cv}; \quad (11)$$

wherein $f_{circuit}(\cdot)$ indicates a demagnetization voltage generation circuit in the charging and discharging device; and $U'_{oper}^{cv}$ is the actual demagnetization voltage value generated by a demagnetization circuit;

in the magnetic field generating device sub-module, transferring the actual demagnetization voltage value $U'_{oper}^{cv}$ generated in the charging and discharging device to a demagnetization coil in the magnetic field generating device to produce a demagnetizing magnetic field with an intensity of $H_{oper}^{Produce}$; and at the same time, demagnetizing the magnetic medium to be demagnetized in the magnetic field generating device to obtain a demagnetized magnetic medium Z, expressed by equation (12):

$$U'_{oper}^{cv} \xrightarrow{f_{coil}(\cdot)} H_{oper}^{Produce} \xrightarrow{f_{demag}(\cdot)} Z; \quad (16)$$

wherein $f_{coil}(\cdot)$ is the demagnetization coil in the magnetic field generating device; $H_{oper}^{Produce}$ is the intensity of the generated demagnetizing magnetic field; $f_{demag}(\cdot)$ represents a physical process of demagnetization; and Z is the demagnetized magnetic medium; and in the magnetic field sensor and environmental sensor sub-module, acquiring a measured value $H_{oper}^{pv}$ of the intensity of the demagnetizing magnetic field intensity via the flux meter; acquiring environmental data $\{t_{emperature}, H_{umidity}, \dots\}$ via the temperature and humidity sensors; feeding $H_{oper}^{pv}$ and $\{t_{emperature}, H_{umidity}, \dots\}$ back to the magnetic field controller; and modifying parameters of the magnetic field controller in a closed loop, and applying modified parameters of the magnetic field controller to demagnetization of a next magnetic medium to be demagnetized to ensure the stability of the demagnetizing field intensity.

\* \* \* \* \*